United States Patent [19]

Karp et al.

[11] Patent Number: 5,615,221
[45] Date of Patent: Mar. 25, 1997

[54] METHOD AND SYSTEM WHICH SELECTIVELY USES DIFFERENT LEVELS OF ERROR CORRECTION TO ACHIEVE HIGH DATA THROUGHPUT

[75] Inventors: James M. Karp; Stephen C. West, both of Tucson, Ariz.

[73] Assignee: International Business Machines Corporation, Armonk, N.Y.

[21] Appl. No.: 479,255

[22] Filed: Jun. 7, 1995

Related U.S. Application Data

[63] Continuation of Ser. No. 914,121, Jul. 17, 1992, abandoned.

[51] Int. Cl.⁶ ............................................. H03M 13/00
[52] U.S. Cl. ............................................. 371/37.1; 371/37.7
[58] Field of Search ........................... 371/37.1, 41, 37.7

[56] References Cited

U.S. PATENT DOCUMENTS

| | | | |
|---|---|---|---|
| 3,078,443 | 2/1963 | Rose | 371/41 |
| 3,496,549 | 2/1970 | Tong | 371/41 |
| 3,668,631 | 6/1972 | Griffith et al. | 371/41 |
| 4,058,851 | 11/1977 | Scheuneman | 395/182.04 |
| 4,074,228 | 2/1978 | Jonscher | 371/45 |
| 4,340,964 | 7/1982 | Sprick et al. | 371/40.1 |
| 4,456,996 | 6/1984 | Haas et al. | 371/37 |
| 4,592,054 | 5/1986 | Namekawa et al. | 371/38.1 |
| 4,646,312 | 2/1987 | Goldsbury et al. | 371/40.1 |
| 4,706,250 | 11/1987 | Patel | 371/39 |
| 4,750,178 | 6/1988 | Sako et al. | 371/37.4 |
| 4,839,896 | 6/1989 | Golver et al. | 371/37.8 |
| 4,979,174 | 12/1990 | Cheng et al. | 371/41 |
| 5,070,503 | 12/1991 | Shikakura | 371/37.1 |
| 5,151,904 | 9/1992 | Reiner et al. | 371/43 |

FOREIGN PATENT DOCUMENTS

| | | | |
|---|---|---|---|
| 0029216 | 11/1979 | European Pat. Off. | G11B 5/09 |
| 2160595 | 12/1971 | Germany | G06F 11/12 |
| 60-183642 | 9/1985 | Japan . | |

OTHER PUBLICATIONS

IEEE Transactions On Communications, vol. 39, No. 4, Apr., 1991, New York US pp. 482–484 "A Hybrid ARQ Scheme With Adaptive Forward Error Correction For Satellite Communications".

Globecom '89. IEEE Global Telecommunications Conference & Exhibition, vol. 2, pp. 1088–1092, "A Versatile Time Domain Reed–Solomon Decoder".

Richard E. Blahut; "Theory and Practice of Error Control Codes"; 1983; Addison–Wesley, Reading, Massachusetts.

Richard E. Blahut; "A Universal Reed–Solomon Decoder"; Dec. 1976; vol. 28 N2, 150–158; IBM Journal of Research and Development.

W. Wesley Peterson and E.J. Weldon; "Error Correcting Codes", Second Edition; 1972; MIT Press, Cambridge, Massachusetts.

*Primary Examiner*—Stephen M. Baker
*Attorney, Agent, or Firm*—Benman, Collins & Sawyer

[57] ABSTRACT

An inexpensive, high performance error detecting and correcting system capable of handling multiple errors with high throughput. Digital data is provided to a reconfigurable decoder which is initially set for a low level of correction and a high throughput. On detection of an error, a signal is generated which is used to dynamically reconfigure the decoder. The decoder is reconfigured at a higher correction level. The data is then reprocessed through the reconfigured decoder. In a specific implementation, the invention uses a Blahut decoder. N and K values to reconfigure the decoder are provided by a microprocessor. The invention contemplates use of an encoder operating at the highest level of correction required. Use of an initial low level of correction provides for a high throughput. Reconfigurability allows for high corrective power and associated lower throughput only when necessary.

6 Claims, 4 Drawing Sheets

METHOD AND SYSTEM WHICH SELECTIVELY USES DIFFERENT LEVELS OF ERROR CORRECTION TO ACHIEVE HIGH DATA THROUGHPUT

This is a continuation of application, Ser. No. 07/914,121, filed Jul. 17, 1992, now abandoned.

BACKGROUND OF THE INVENTION

1. Field of the Invention

The present invention relates to digital data communication, storage and retrieval. More specifically, the present invention relates to systems for detecting and correcting errors in digital data communication, storage and retrieval systems.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

In the communication, storage and retrieval of digital data, errors arise due to noise, media defects, component aging and other parameters. Numerous schemes have been developed to detect and correct these errors. One early approach involved the simple retransmission of the data on the detection of an error condition. Unfortunately, in a noisy environment, frequent retransmission may be required. Frequent retransmission severely limits the throughput or bandwidth of the system.

Accordingly, numerous coding schemes have been developed to correct detected errors without retransmission. In these coding schemes, data bits are grouped into symbols of one or more data bits with one or more redundant symbols to facilitate error detection and correction. The number of data and redundant symbols used and the type of encoder and decoder used varies with the coding scheme selected.

In the design and/or selection of an optimal coding scheme, the designer is forced into a tradeoff between error correction power, decoder circuit complexity and bandwidth. That is, the greater the correction power of the code, the higher the "overhead" in terms of the number of redundant symbols, and the lower the sustained data rate of actual symbols. By way of example, a 10% increase in overhead may result in a 10% decrease in system throughput.

In addition, the greater the correction power of the code and the resulting higher number of redundant symbols employed, the greater the complexity of the circuitry in the decoder system.

Accordingly, many error detecting and correcting systems have heretofore been designed to provide the degree of error correcting power required for a given maximum error case. Reed-Solomon codes have been found to be well suited and are frequently selected as the code of choice. Reed-Solomon codes are a well known subset of the class of Bose-Chaudhuri-Hocquenghem (BCH) codes.

A Reed-Solomon code is typically the code of choice for at least two major reasons. First, Reed-Solomon codes are MDS (maximum-distance-separatable) codes which implies optimal performance for many error conditions encountered. Secondly, Reed-Solomon codes are sufficiently well behaved that exact performance can be predicted if the input error distribution can be described.

For example, if the input symbol probability of error is 'p' and each symbol's error status is independent of all other symbols, it is a simple matter to compute the number of symbols in error in any randomly selected codeword (assuming an (n,k) code and i=0 to n symbols in error):

$$P(errors) = C(n,i) * p^i * (1-p)^{n-i}$$

where $C(n,i)$=the number of combinations of n things take i at a time.

Now consider the case where n=28, k=20 and p is equal to 0.0001. Using the above equation, the following approximate probabilities may be computed:

P(0 errors)=9.9720378 * 0.1

P(1 error)=2.7924498 * 0.001

P(2 errors)=3.7701843 * 0.000001

P(3 errors)=3.2678198 * 0.000000001

P(4 errors)=2.0425916 * 0.000000000001

The probabilities are approximately 3 orders of magnitude smaller for the i+1th error condition than for the ith error condition.

Error correction decoders require many more steps (and time) to process (detect and correct) progressively more errors. These decoders are configured to operate in a maximum decode mode, i.e., always decode for worst case condition even when there are fewer errors or no errors. Such decoders can either represent the throughput bottlenecks for the systems in which they are embedded or require multiple decoders to run in parallel (a hardware cost and circuit reliability penalty) to achieve the desired throughput rate. As can be seen from the example above, such a penalty can be incurred for something that occurs very, very infrequently.

As an alternative, another approach involves the transmission of data at a first high data rate and a low level of correcting power. On detection of an error, the data is retransmitted at a lower rate with a more powerful error detecting and correcting code. To maintain a minimum desired throughput, the system must either operate at a higher clock speed or use multiple parallel decoders. Increases in clock speed are difficult to achieve due to the high costs associated with faster technologies and limitations on clocking speed of all technologies. As a result, use of multiple decoders tends to be a preferred approach. However, decoders are generally a costly and complex component of the system. Accordingly, improvements in throughput afforded by the use of multiple decoders are often offset by the high cost associated therewith.

Accordingly, there is a need in the art for an inexpensive, high performance error detecting and correcting system which is capable of handling multiple errors with high throughput.

SUMMARY OF THE INVENTION

The need in the art is addressed by the error detecting and correcting system of the present invention. In a most general sense, digital data is provided to a reconfigurable decoder. The decoder is initially set for a low level of correction and a high throughput. On detection of an error, a signal is generated which is used to dynamically reconfigure the decoder. The decoder is reconfigured at a higher correction level. The data is then reprocessed through the reconfigured decoder.

In a specific implementation, the invention is designed for use with a Blahut decoder. In the specific implementation, N and K values to reconfigure the decoder are provided by a microprocessor. The invention contemplates use of an encoder operating at the highest level of correction required. Use of an initial low level of correction provides for a high throughput. Reconfigurability allows for high corrective power and associated lower throughput only when necessary.

Thus, the present invention provides an inexpensive, high performance error detecting and correcting system which is capable of handling multiple errors with high throughput.

DESCRIPTION OF THE INVENTION

Illustrative embodiments and exemplary applications will now be described with reference to the accompanying drawings to disclose the advantageous teachings of the present invention.

Figure 1:
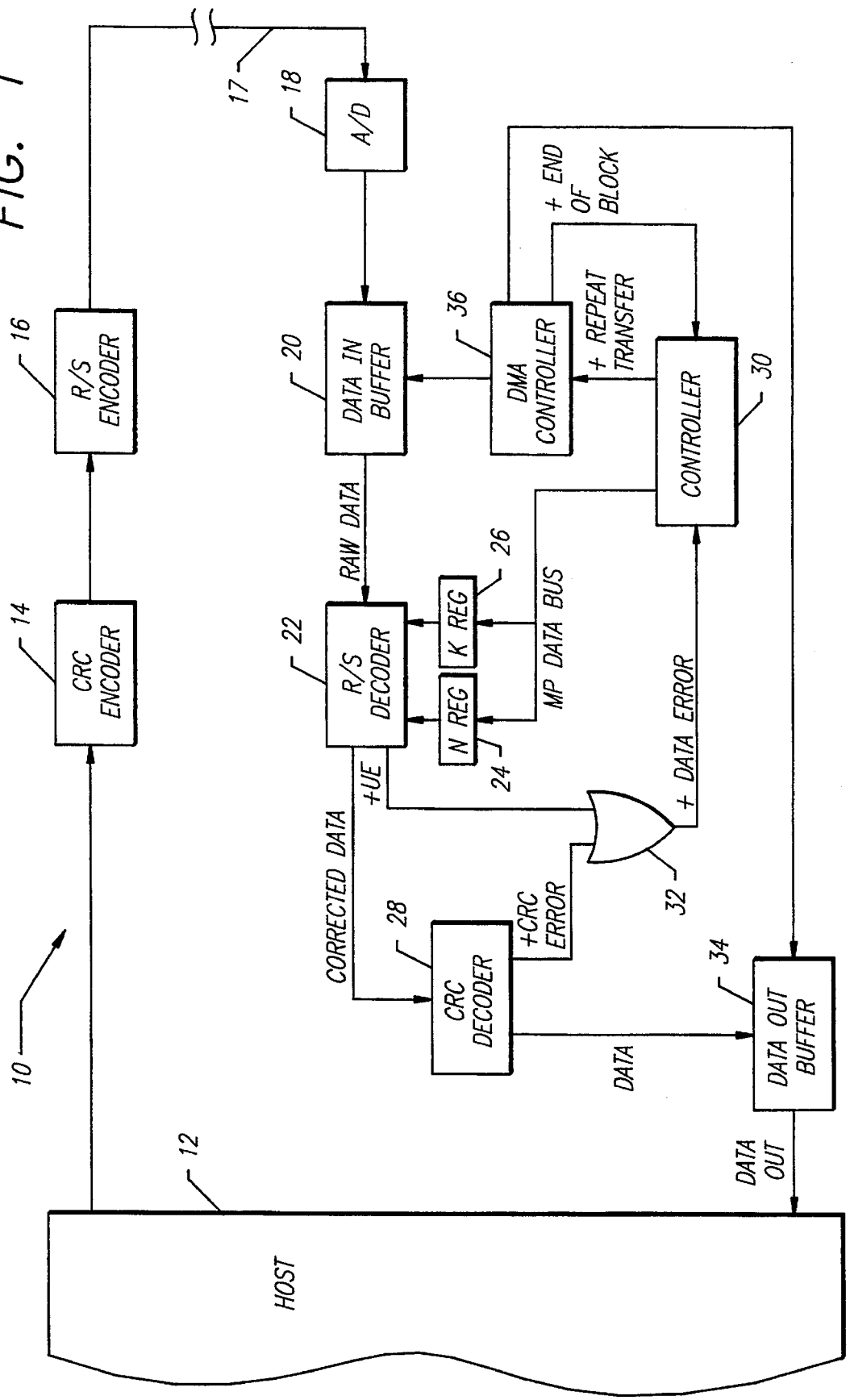
FIG. 1 is a block diagram of the error detecting and correcting system of the present invention.

FIG. 1 is a block diagram of the error detecting and correcting system 10 of the present invention. The invention is adapted for use with a host system 12 which may be a computer, peripheral or any source of data for transmission, processing, storage and/or retrieval. The system 10 of the present invention includes CRC (cyclic redundancy check) encoder 14. The CRC encoder 14 processes data from the host 12 with a polynomial that generates a remainder. The remainder is represented by one or more redundant symbols which are added to the data word and forwarded to an error correcting code encoder 16.

Figure 2:
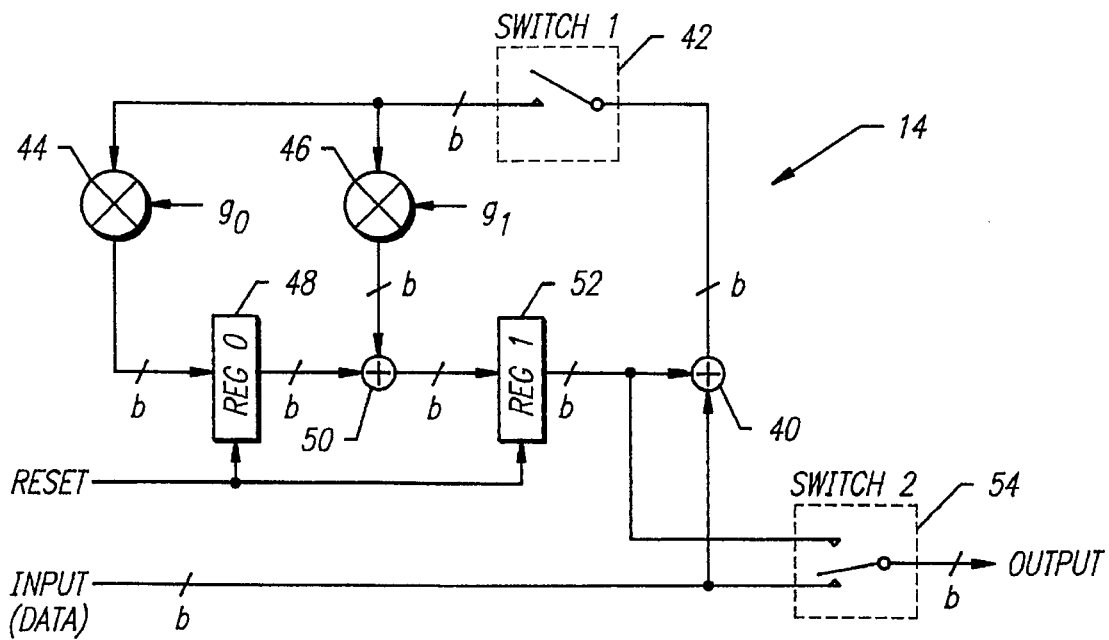
FIG. 2 is a simplified block diagram of the CRC encoder utilized in the error detecting and correcting system of the present invention.

FIG. 2 is a block diagram of an illustrative implementation of the CRC encoder 14. The encoder 14 includes an input summing circuit 40. The summing circuit 40 may be implemented with a bit-by-bit exclusive OR gate. The summing circuit 40 performs a Galois Field sum of input symbol and the contents of a register REG1. Galois operations and operators are well known in the art. The feedback loop includes a first single-pole single-throw (SPST) type switch 42. (As will be appreciated by those skilled in the art, the switches utilized in the illustrative embodiments disclosed herein may be implemented with electronic switching gates and circuits.) The first switch 42 allows for the output of the summing circuit 40 to be selectively applied to first and second Galois field multipliers 44 and 46. The output of the first multiplier 44 is stored in a first register 48 then supplied to a second summing circuit 50. The second input to the second summing circuit 50 is provided by the second multiplier 46. The summed signal is stored in a second register 52 before being supplied as the second input to the first summing circuit 40 and to a first throw of a second switch 54. The second switch 54 is preferably a single-pole double-throw (SPDT) switch. The second switch 54 allows for selective bypass of the encoder 14 such that the output thereof is data along with CRC symbols. Thus, the encoder 14 accepts a b-bit data input bus and provides a b-bit output bus with both data and CRC symbols.

The encoding process is initiated by resetting the registers 48 and 52 to zero, closing the first switch 42 and setting the second switch 54 in the down position. The data symbols are then sequentially clocked into the input summing circuit and simultaneously passed through the second switch 54 onto the output bus. As each data symbol is clocked into the first summing circuit 40, the output of the summing circuit is passed through the first switch on to the Galois Field Multipliers 44 and 46. The Galois Field multipliers modify the feedback bits and pass them on to the inputs of the first and second registers 48 and 52. At the next clock pulse, these inputs are clocked into the registers at the same time that the next data symbol is input onto the input bus. The input summing, feedback, multiplication and registering is continued until all of the data symbols for that code word or data block are input, at which time the two switches are activated such that the first switch 42 is open and the second switch 54 is in the up position. The registers are clocked twice to pass their contents out on the output bus, thus appending the two b-bit CRC symbols to the data block, creating the CRC codeword.

If the primitive polynomial $x^8+x^4+x^3+x^2+1$ defines the Galois Field of 256 elements, where these 256 elements can be represented as $0, \alpha^0, \alpha^1, \alpha^2, \ldots, \alpha^{253}, \alpha^{254}$. If we define the roots of the CRC generator polynomial as $\alpha^1, \alpha^2$, we obtain the following generator polynomial $g(x)=x^2+\alpha^{26}x+\alpha^3$. The encoder for this generator polynomial can be implemented by the circuit of FIG. 2 with the following assignments $g_0=\alpha^3$ and $g_1=\alpha^{26}$.

Figure 3:
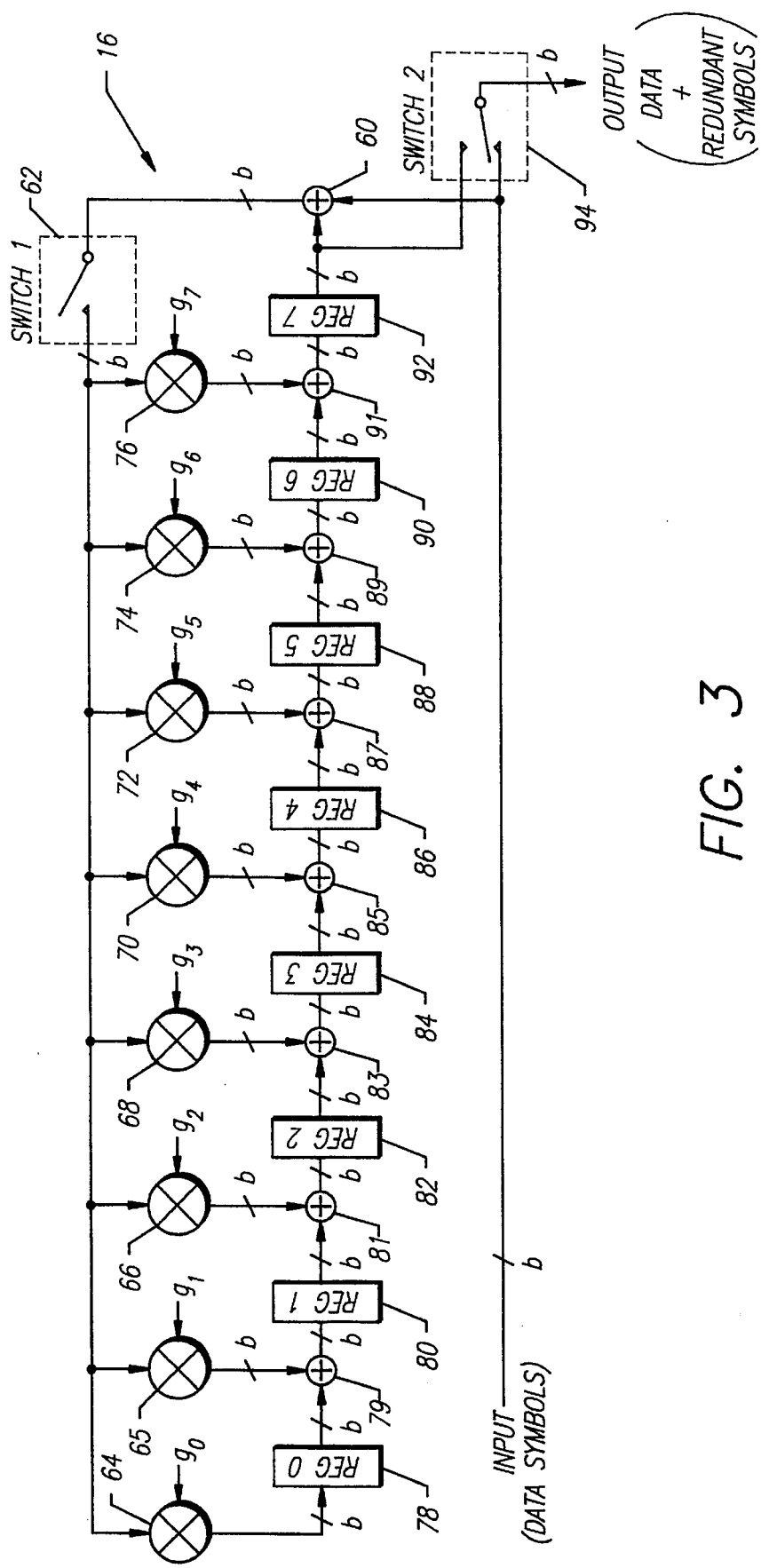
FIG. 3 is a simplified block diagram of the Reed-Solomon encoder utilized in the error detecting and correcting system of the present invention.

The encoder 16 is, in the preferred embodiment, a Reed-Solomon encoder which breaks the data and CRC check symbols into codewords which include Reed-Solomon redundant symbols. FIG. 3 is a simplified block diagram of the Reed-Solomon encoder 16. The earlier (28,20) code example will be continued to illustrate the implementation of the Reed-Solomon encoder 16 for the present invention. The primitive polynomial $x^8+x^4+x^3+x^2+1$ defines a Galois Field of 256 elements. The 256 Galois Field elements can be represented as $0, \alpha^0, \alpha^1, \alpha^2, \ldots, \alpha^{253}, \alpha^{254}$. We can define the roots of the generator polynomial, for the exemplary (28,20) Reed-Solomon code, to be any eight consecutive powers of the field primitive element $\alpha$. One such set of eight consecutive powers of $\alpha$ is $\alpha^1, \alpha^2, \alpha^3, \alpha^4, \alpha^5, \alpha^6, \alpha^7, \alpha^8$. These roots define the generator polynomial $$g(x)=x^8+\alpha^{176}x^7+\alpha^{240}x^6+\alpha^{211}x^5+\alpha^{253}x^4+\alpha^{220}x^3+\alpha^3x^2+\alpha^{203}x+\alpha^{36}.$$

As illustrated in FIG. 3, this polynomial is implemented by the Reed-Solomon encoder 16 of the present invention where:

$g_0=\alpha^{36}$ $g_1=\alpha^{203}$ $g_2=\alpha^3$ $g_3=\alpha^{220}$ $g_4=\alpha^{253}$ $g_5=\alpha^{211}$ $g_6=\alpha^{240}$ $g_7=\alpha^{176}$ The k data symbols, each data symbol being b bits wide (at eight bits per symbol for the defined Galois Field) are sequentially clocked into an input summing circuit 60 and summed with the contents of a register 92. The sum is passed through a first SPST switch 62 and into a bank of Galois Field multipliers 64, 65, 66, 68, 70, 72, 74 and 76. The multiplied values are passed to the in-line summers 79–92 (odd numbers only), summed with the preceding stage register contents and clocked into the appropriate register. This is continued until all 20 data symbols are input, summed, multiplied, summed and registered. After the 20 data symbols have been clocked into the circuit 16, the required redundant symbols are now contained in the eight registers 78–92 (even numbers only). The first switch 62 is opened and the second switch is moved to connect the eighth register 92 to the output bus (previously the input data symbols were being passed onto the output bus). The encoder 16 is clocked an additional eight times to move the eight redundant symbols out of the registers and onto the output bus. Each group of 28 symbols (20 data and 8 redundant) represent codewords for the defined (28,20) Reed-Solomon code. The process can now be repeated any number of times until all of the message data and CRC symbols are encoded and passed out on the output bus.

The encoded data is converted to a series of analog signals and transmitted over a channel 17. The channel may be an electromagnetic, laser, microwave or radio frequency link or a direct electrical connection depending on the application.

Figure 4:
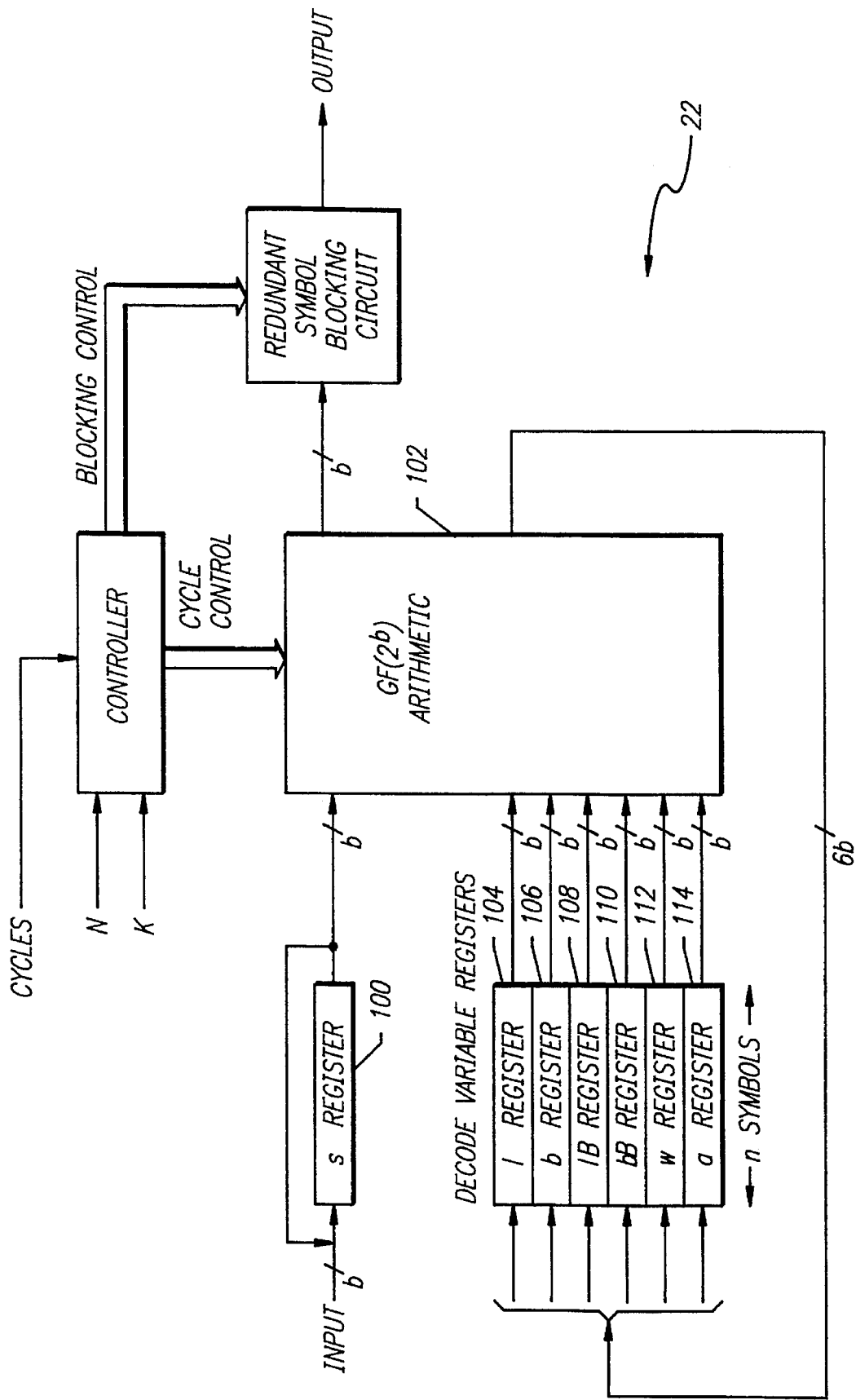
FIG. 4 is a simplified block diagram of the reconfigurable decoder utilized in the error detecting and correcting system of the present invention.

The analog data is received over the channel 17 and digitized by an analog-to-digital converter 18, then stored in a Data In buffer 20. The raw data in the buffer is decoded by a reconfigurable Reed-Solomon (RS) decoder 22. FIG. 4 is a simplified block diagram of the decoder 22. As depicted in FIG. 4, in the current best mode, the decoder 22 is implemented as a Blahut decoder such as that described in "A Universal Reed-Solomon Decoder" authored by Richard E. Blahut and published in the IBM Journal of Research and Development, vol 28, N2, pp 150–158, March 1984. See also "Theory and Practice of Error Control Codes" authored by Richard E. Blahut and published by Addison-Wesley of Reading, Massachusetts in 1983 and "Error Correcting Codes" by Peterson, W. Wesley and E. J. Weldon, Jr., 2nd edition, published by MIT Press, Cambridge, Massachusetts in 1972.

In FIG. 4, the 'n' symbol received word is input to the 's' register 100. The Galois Field arithmetic unit 102 is appropriately initialized and 6 decode variable registers 104–114 (even numbers only) are zeroed. The 'n' symbol received word and the 'n' symbol decode variable words are sequentially clocked into the Galois Field arithmetic unit 102. The arithmetic unit 102 sequentially processes the sets of 7 input symbols in a conventional manner and outputs a set of 6 updated decode variables that are written into the decode variable registers 104–114. One cycle is completed after 'n' clocks or one complete pass through of all of the 'n' symbols in the received word register and the 'n' symbols in the decode variable registers. At the completion of each cycle, the arithmetic control variables are updated and the cycle is repeated. The process continues until '2t' cycles have completed, at which time a different branch (internal to the arithmetic unit) is taken and the received word is corrected and passed out the output port. The decoder 22 is now ready to start the process again for a new received word. The initialization cycle and the correction cycle can be staged such that they overlap and the arithmetic unit 102 can be kept busy for all cycles.

If the decoder 22 were to be run for fewer than the '2t' cycles, the output would be correct as long as the number of errors were equal to or fewer than half the programmed number of cycles (the new reduced number of cycles). If the decoder 22 is run in a reduced mode, the output data stream would need to be appropriately enabled/disabled by a conventional redundant symbol blocking circuit 103 to eliminate the redundant symbols.

Figure 5:
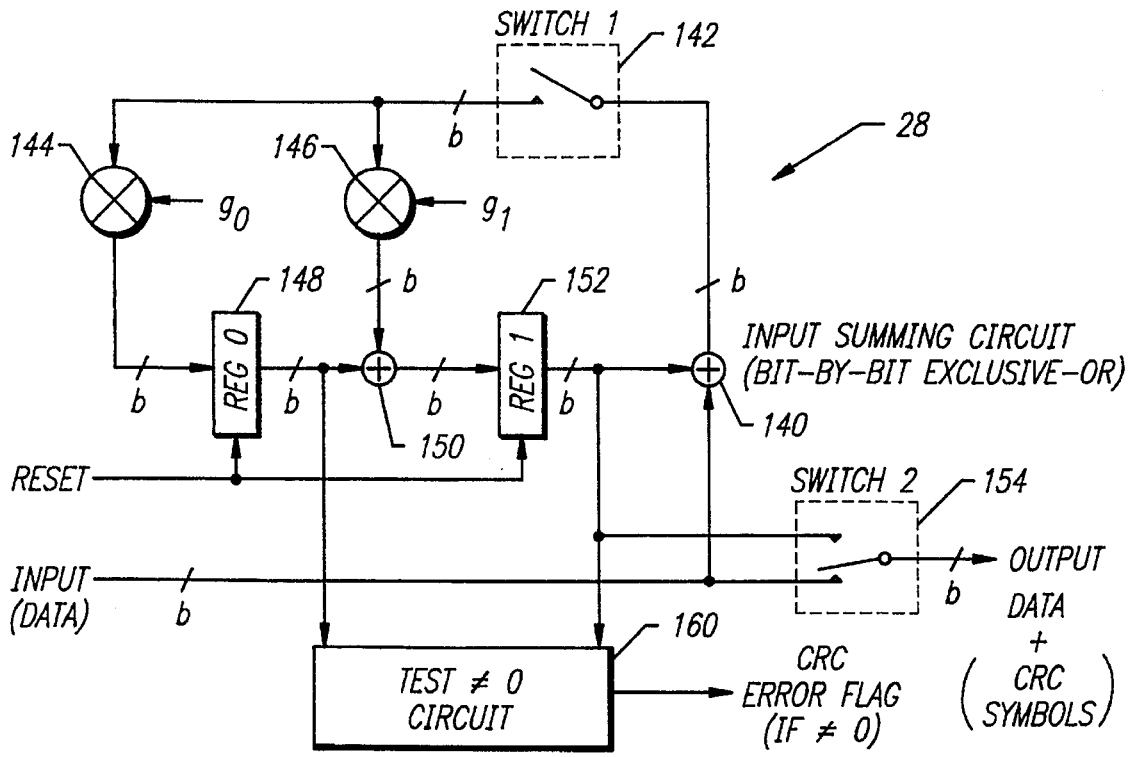
FIG. 5 is a simplified block diagram of an illustrative implementation of the CRC decoder utilized in the error detecting and correcting system of the present invention.

Corrected data from the decoder 22 is provided to the CRC decoder 28. A simplified block diagram of an illustrative implementation of the CRC decoder 28 is shown in FIG. 5. The decoder 28 includes an input summing circuit 140. The summing circuit 140 may be implemented with a bit-by-bit exclusive OR gate. The summing circuit 140 performs a Galois Field sum of input symbol and the contents of a register REG1. A feedback loop allows for the output of the summing circuit 140 to be applied to first and second Galois field multipliers 144 and 146. The output of the first multiplier 144 is stored in a first register 148 then supplied to a second summing circuit 150. The second input to the second summing circuit 150 is provided by the second multiplier 146. The summed signal is stored in a second register 152 before being supplied as the second input to the first summing circuit 140 and to a switch 154. The switch 154 is a single-pole double-throw (SPDT) type switch. The switch 154 allows for selective a bypass of the decoder 28 such that the output thereof is data along with CRC symbols.

In operation, the registers 148 and 152 are reset to zero and the data symbols are clocked into the input summing circuit 140, through the Galois Field multipliers 144 and 146 and into the registers 148 and 152. These data symbols are also passed through the switch 154 and forwarded to the output data buffer 34 of FIG. 1. Next, the switch 154 is open. This blocks the incoming CRC symbols from being passed to the output data buffer 34. When all of the data symbols have been input to the decoder 28, the two registers 148 and 152 should contain the previously computed CRC symbols (assuming no errors have occurred). Next, the two CRC symbols are input to the decoder 28 on the next two clock periods. If the two registers 148 and 152 contain the correct CRC symbols and the two received CRC symbols are not corrupted, the feedback signal out of the summer 140 will be the all zero element for both of the CRC symbols input and the registers 148 and 152 will contain this zero element. This is due to the fact that the registers contain the two CRC symbols and the registers will sum to zero in the summer circuit 140.

A test circuit 160 detects unsuccessful decode operations and provides outputs a CRC error signal. The test circuit 160 may be implemented with a "2 times b"-bit wide OR gate The test circuit will output a "zero" for example, if no error condition is detected. If an error is detected the registers 148 and 152 will contain at least one nonzero bit and the test circuit 160 will output a "one" or an error flag indicator. The test circuit 160 output is only valid after all of the data symbols and the CRC symbols have been clocked into the decoder circuit 28 and the two registers 148 and 152 contain the error syndrome.

In this manner, the decoder 28 performs CRC error checking on the corrected data and, if there is no error, outputs the data to a data output buffer 34. If there is an error, the CRC decoder 22 provides a signal to the controller 30 via the summer 32 as described above. As described more fully in the description of the operation of the system 10 below, on receipt of an error signal, the controller 30 inhibits the output of data from the Data Out buffer 34 to the host 12, reconfigures the reconfigurable RS decoder 22, and reinitiates the processing of the same set of raw data stored in the Data In buffer 20 as initially processed during a given data transmission cycle.

Control of the Data In and Data Out buffers is facilitated through a conventional memory control arrangement. Although, in an actual implementation, memory control is distributed to the buffers, the memory control mechanism is depicted as a single DMA (direct memory access) controller 36 for the purpose of illustration.

In operation, the RS encoder circuit 16 encodes the data into codewords at a maximum power level available for the system 10. A multiple number of codewords are grouped together as a data block or data sector and further protected with CRC check bits by the CRC encoder 14. The exact grouping is system dependent.

On receipt, uncorrected data block is loaded into the Data In buffer 20 from the read channel 17 or previous circuits. The uncorrected data is unloaded from the Data In buffer 20 to the RS decoder 22 under control of the DMA controller 36. The RS decoder 22 processes the data with the N and K control registers 24 and 26 set to, say, half the maximum correcting power of the system. For example, if the encoder is transmitting at a maximum correcting power of (28,20) the decoder 22 might be initially set at (28,24) with half as many error correcting bits and, as a result, 50% higher throughput or bandwidth. The corrected data out of the decoder 22 is checked by the CRC decoder 28 and loaded into the Data Out buffer 34 under control of the DMA controller 36.

When an entire data block has been processed through the decoder 22 and CRC decoder 28, and "end-of-block" interrupt is generated to the controller 30. The controller 30 examines the state of the error signal from the summer 32. The error signal is the logical OR of 1) the detection of an uncorrectable error (UE) by the decoder 22 on any codeword processed in the data block and 2) the detection of a CRC error over the corrected data block.

If no error is detected, the corrected data in the Data Out buffer 34 is scheduled for transfer to the host.

If an error is detected, indicating that the reduced correcting power of the decoder has been exceeded, the controller 30 then reloads the N and K registers 24 and 26, respectively, with the full power values, e.g., (28,20), and issues a 'repeat transfer' signal to the DMA controller 36. The data block is, once again, processed by the decoder 22 and loaded back into the Data Out buffer 34. This time, however, the decoder 22 is operating at full power but the processing time is substantially increased, i.e., doubled with the exemplary codes. Thus, the error correcting processing time will take twice as long on the second pass. Note that the exemplary half power/half data rate example is arbitrary. These ratios will be adjusted to take advantage of the error profile for each unique system, as well as the price/performance tradeoff for different market segments.

When the failing data block has been reprocessed through the decoder 22, an "end-of-block" interrupt is generated to the controller 30. The controller 30 again examines the state of the error signal from the summer 32. If no error signal is present, the corrected Data In the Data Out buffer 34 is scheduled for transfer to the host 12.

If an error signal is present, it signals that an error has occurred which exceeds the maximum error correcting power of the system 10, i.e., a permanent error.

When reprocessing is in order, the additional codeword processing time for codewords that must be reprocessed is averaged over a large number of codewords. Accordingly, there should be little impact on the data rate.

Most data blocks will be corrected in the reduced power mode. When full power is required, it will take three times as long to process a failing block as a non-failing block. While the predictability of this time delay is advantageous, it may be handled in one of two ways. The Data In buffer 20 may be designed with capacity to store several data blocks and the decoder 22 may be designed to run slightly faster than the incoming data rate, e.g., 5%. In this manner, the variations in block transfer time are absorbed by the buffer.

In the alternative, in a magnetic or optical disk application, it may be desirable to simply make another revolution around the disk while the failing block is being processed. Then, transmission is restarted on the block following the failing block. In a magnetic tape environment, it may be desirable to integrate this processing mode with a "tape STOP", "backhitch" and "forward locate" to the block following the block in error. The failing block can be corrected while the tape is being repositioned.

Those skilled in the art will appreciate that by trading-off data rate and code power, the present inventions allows for a self-optimizing communication system. Such systems might be used in a modem link, for example, and would adaptively increase the transfer rate until a certain percent of the blocks require reprocessing, thereby improving performance of a fixed error correcting scheme.

Thus, the present invention has been described herein with reference to a particular embodiment for a particular application. Those having ordinary skill in the art and access to the present teachings will recognize additional modifications applications and embodiments within the scope thereof. For example, the invention is not limited to use of CRC codes. Those skilled in the art will appreciate that the CRC encoder and decoder are optional and not required to practice the teachings of the present disclosure. The CRC encoder and decoder provide an additional degree of error checking to supplement the error detecting and correcting code utilized in the present invention. Further, the controller may be implemented as a state machine with combinational logic or another mechanism without departing from the scope of the invention. In addition, the data storage buffers may be implemented in a single physical memory with logical partitions.

It is therefore intended by the appended claims to cover any and all such applications, modifications and embodiments within the scope of the present invention.

Accordingly,

What is claimed is:

1. An error detecting and correcting system comprising:

first means for providing a block of digital data;

second means for encoding said block of digital data at a first correction level;

third means for communicating said block of encoded data over a channel;

fourth means for receiving said block of encoded data communicated over said channel;

fifth means for storing said received block of encoded data;

sixth means for decoding said received block of encoded data at a second correction level to provide decoded data, said second correction level being less than said first correction level;

seventh means for detecting errors in said decoded data; and eighth means, responsive to said seventh means, for decoding said received block of encoded data at a third correction level in response to detection of an error in said decoded data, said third correction level being higher than said second correction level.

2. The system as set forth in claim 1, wherein said third correction level is the same as said first correction level.

3. The system as set forth in claim 1, wherein said eighth means is responsive to said seventh means for decoding said received block of encoded data at a third correction level in response to a first detection of an error in said decoded data.

4. A method for detecting and correcting errors including the steps of:

provviding a block of digital data;

encoding said block of digital data at a first correction level;

communicating said block of encoded data over a channel;

receiving said block of encoded data communicated over said channel;

storing said received block of encoded data;

decoding said received block of encoded data at a second correction level to provide decoded data, said second correction level being less than said first correction level;

detecting errors in said decoded data; and then decoding said received block of encoded data at a third correction level in response to detection of an error in said decoded data, said third correction level being higher than said second correction level.

5. The method as set forth in claim 4, wherein said third correction level is the same as said first correction level.

6. The method as set forth in claim 4, wherein the last-recited decoding step is carried out by decoding said received block of encoded data at a third correction level in response to a first detection of an error in said decoded data.

* * * * *

UNITED STATES PATENT AND TRADEMARK OFFICE
CERTIFICATE OF CORRECTION

PATENT NO. : 5,615,221
DATED : Mar. 25, 1997
INVENTOR(S) : James M. Karp; Stephen C. West It is certified that error appears in the above-indentified patent and that said Letters Patent is hereby corrected as shown below:

On title page, item [54], before "METHOD", please add --ERROR CORRECTION--;
At column 1, line 1, before "METHOD", please add -- ERROR CORRECTION--;
line 47, after "overhead", please add --,--;
At column 2, line 10, please change "(errors)" to --(i errors)--.

Signed and Sealed this

Seventeenth Day of March, 1998

Attest:

BRUCE LEHMAN

Attesting Officer

Commissioner of Patents and Trademarks